United States Patent [19]

Groe

[11] Patent Number: 5,570,056
[45] Date of Patent: Oct. 29, 1996

[54] BIPOLAR ANALOG MULTIPLIERS FOR LOW VOLTAGE APPLICATIONS

[75] Inventor: John B. Groe, Poway, Calif.

[73] Assignee: Pacific Communication Sciences, Inc., San Diego, Calif.

[21] Appl. No.: 485,088

[22] Filed: Jun. 7, 1995

[51] Int. Cl.$^6$ .............................. H03B 17/00; H04B 1/28
[52] U.S. Cl. ........................... 327/359; 327/358; 327/411; 455/326
[58] Field of Search .................................. 327/355, 359, 327/358, 563, 407, 411, 413, 361, 99; 455/189.1, 326, 209

[56] References Cited

U.S. PATENT DOCUMENTS

| | | | |
|---|---|---|---|
| 3,588,479 | 6/1971 | Henderson | 364/606 |
| 3,629,567 | 12/1971 | Bruggeman | 364/841 |
| 3,662,187 | 5/1972 | Ayres | 327/359 |
| 3,681,586 | 8/1972 | Kitaura | 364/849 |
| 3,805,092 | 4/1974 | Henson | 327/356 |
| 4,004,141 | 1/1977 | Curtis | 364/841 |
| 4,039,868 | 8/1977 | Aono | 327/172 |
| 4,247,789 | 1/1981 | Cate | 327/356 |
| 4,308,471 | 12/1981 | Misawa | 327/355 |
| 4,572,975 | 2/1986 | Bowers | 327/359 |
| 4,704,738 | 11/1987 | Graziadei et al. | 455/253 |
| 4,835,771 | 5/1989 | Moussie | 327/411 |
| 5,057,716 | 10/1991 | Küng | 327/358 |
| 5,086,241 | 2/1992 | Nakayama | 327/359 |
| 5,122,687 | 6/1992 | Schmidt | 327/359 |
| 5,329,189 | 7/1994 | Ushida et al. | 327/355 |
| 5,396,659 | 3/1995 | Kimura | 455/333 |
| 5,402,013 | 3/1995 | Friedrich | 327/411 |
| 5,438,296 | 8/1995 | Kimura | 327/359 |
| 5,444,399 | 8/1995 | Shiga | 327/355 |

*Primary Examiner*—Timothy P. Callahan
*Assistant Examiner*—My-trang Nu Ton
*Attorney, Agent, or Firm*—Merle W. Richman, III; Martin J. Jaquez

[57] ABSTRACT

An analog circuit for multiplying a first input signal with a second input signal. The inventive analog circuit is capable of linear operation with a low voltage power source. A first pair of transistors is coupled as a first differential pair, and a second pair of transistors is coupled as a second differential pair. The first differential pair is coupled to the second differential pair in a manner that is similar to the corrections made between a first and second differential pair of a conventional Gilbert mixer. However, the emitter degeneration resistors of the present invention are not coupled to the collectors of a third differential pair, as is the case in conventional Gilbert mixers. Rather, the degeneration resistors of the present invention are coupled directly to the negative power supply terminal. Instead of the third differential pair used in a conventional Gilbert mixer, a third differential pair of transistors, having degeneration resistors coupled to each emitter, is coupled generally in parallel with the first and second differential pair. The collectors of each of the transistors of the third differential pair are coupled to the positive power supply terminal. Each degeneration resistor is coupled to a different one of the two tail resistors. An LO signal is input across the bases of the differential pair. The third differential pair provides a means for modulating the tail current of the first two differential pairs.

23 Claims, 4 Drawing Sheets

BIPOLAR ANALOG MULTIPLIERS FOR LOW VOLTAGE APPLICATIONS

BACKGROUND OF THE INVENTION

1. Field of the Invention

This invention relates to analog multiplier circuits, and more particularly to an analog multiplier circuit which operates at low power supply voltages.

2. Description of Related Art

Multipliers are key components in communications equipment, such as radios. The frequency of the output of the mixer is the product of the frequency of a local oscillator (LO) signal and an intermediate frequency (IF) signal. Multipliers which are not linear with respect to both inputs are commonly referred to as mixers. Mixers are used to down-convert (i.e., translate to a lower frequency) a signal received by a radio front end. This process, called heterodyning, allows signals to be broadcast at relatively high frequencies, and then down-converted to intermediate frequencies which are easier to process within a radio. Likewise, when broadcasting, a radio will modulate information upon an intermediate frequency signal. This intermediate frequency signal is then up-converted to an RF signal which is then broadcast.

FIG. 1 is a circuit diagram of a prior art mixer circuit commonly referred to as a "diode-ring" mixer. This mixer is shown for down-conversion. That is, an RF signal and an LO signal are input to the mixer to generate an IF output signal which has a frequency that is equal to the frequency of the RF signal minus the frequency of the LO signal. This circuit requires an LO signal with a relatively high power level. The diode-ring circuit shown in Figure 1 performs mixing on essentially voltage mode signals (diodes have a low on resistance, controlled by the LO signal). Typically, the LO drive must exceed the largest RF signal by a margin sufficient to ensure that the RF signal does not switch the diodes of the mixer when the polarity of the RF signal opposes the polarity of the LO signal. For example, a "Level 17" mixer requires +17 dBm of LO drive to handle an RF signal of +10 dBm. Also, to reduce non-linearity, the diodes are sometimes operated at extremely high currents.

Furthermore, because of the highly non-linear nature of diodes, the impedance of each of the three ports is also non-linear. That is, the impedance at each port will vary with changes in the signal level. Consequently, exact impedance matching at the ports is not possible. Furthermore, there is substantial coupling between the three ports which, taken together with the high LO power needed, makes it likely that a distorted form of the LO signal will be present in the RF output. Additionally, the circuit shown in Figure 1 is not capable of providing conversion gain. In fact, the minimum theoretical loss is (3.9 dBm). Practical mixers using the circuit of FIG. 1 have losses which are always higher than the theoretical minimum.

In an attempt to design a mixer that overcomes some of the disadvantages of the circuit shown in FIG. 1, the circuit shown in FIG. 2 was developed. The circuit shown in FIG. 2 is often referred to as a "Gilbert" mixer. Gilbert mixers can be fabricated in monolithic form. Furthermore, Gilbert mixers can provide conversion gain and require relatively low power at the LO port. Still further, Gilbert mixers provide high isolation between ports and are relatively insensitive to the impedance of devices coupled to the input ports.

Active mixers (such as the Gilbert mixer of FIG. 2) operate in current-mode. Transistors Q3–Q6 are controlled by current from the voltage-current converter Q1, Q2. The output is provided across load resisters RL1 and RL2. The use of a differential output allows the voltage gain to be doubled.

The Gilbert mixer has good port-to-port isolation, because the Gilbert mixer is "doubly-balanced". That is, in the absence of any RF signal (i.e., a voltage difference between Q1 and Q2) the collector currents are essentially equal, and the voltage at the LO results in no change of the output signal. In addition, if an RF signal is applied, but no voltage difference is present at the LO input, the outputs are likewise balanced. Only when a signal is present at both ports (LO and RF) is an output signal generated. In addition, the Gilbert mixer of FIG. 2 provides better isolation than the diode ring of FIG. 1 due to the reversed biased transistor junctions of the Gilbert mixer.

However, the supply voltage (V+) used with Gilbert mixer must be high enough to allow linear operation of each of the six transistors Q1–Q6. If any of the transistors Q1–Q6 begin operating outside the linear operating region, the IF output will become distorted. Therefore, the supply voltage used to power a Gilbert mixer must typically have a voltage of at least approximately 2.0 volts to 2.5 volts to ensure that the transistors Q1–Q6 remain in the linear region of operation. However, if an active constant current source is provided in the tail of each differential pair, then even greater voltage is required.

Because power supply demands are preferably minimized in portable communication systems, it would be desirable to provide a mixer which operates linearly at relatively low supply voltage levels, has robust output levels, provides gain conversion, and can be manufactured using conventional monolithic or integrated circuit techniques. It can be seen from the above description of the Gilbert mixer that the LO signal, the RF signal, or the IF signal may be applied to either of the two inputs. In the case in which down-conversion is desired, the RF and LO signals are each applied to one of the two inputs such that the output is an IF signal. In the case in which up-conversion is desired, the IF and LO signals are each applied to the one of the two inputs such that the output is an RF signal. The present invention provides such a circuit.

SUMMARY OF THE INVENTION

The present invention is an analog circuit for multiplying a first input signal with a second input signal. The inventive analog circuit is capable of lines operation with a low voltage power source. Low voltage power sources are desirable in portable communications devices to maintain low overall weight and size. Accordingly, the present invention is well-suited for use in portable communication devices in which reduction of weight and size is an important goal.

In accordance with the present invention, a first pair of transistors is coupled as a first differential pair, and a second pair of transistors is coupled as a second differential pair. The first differential pair is coupled to the second differential pair in a manner that is similar to the connections made between a first and second differential pair of a conventional Gilbert mixer. That is, the base of a first transistor of the first pair is coupled to the base of a second transistor of the second pair. The base of a second transistor of the first pair is coupled to the base of a first transistor of the second pair. The collector of the first transistor of the first pair is coupled to the collector of the first transistor of the second pair. The collector of the second transistor of the first pair is coupled to the collector of the second transistor of the second pair. An IF input signal is provided at the bases of the two differential pairs. The emitters of each of the four transistors of the two differential pairs are coupled to a corresponding emitter degeneration resistor which linearizes the transistor operation in conventional fashion. Each of these connections is similar to connections in conventional Gilbert mixers. However, the emitter degeneration resistors of the present invention are not coupled to the collectors of a third differential pair, as is the case in conventional Gilbert mixers. Rather, the degeneration resistors of the present invention are coupled directly to the negative power supply terminal through the tail resistors.

Instead of the third differential pair used in a conventional Gilbert mixer, a third differential pair of transistors, having degeneration resistors coupled to each emitter, is coupled generally in parallel with the first and second differential pair. The collectors of each of the transistors of the third differential pair are coupled to the positive power supply terminal. Each degeneration resistor is coupled to a different one of the two tail resistors. An LO signal is input across the bases of the differential pair. The third differential pair provides a means for modulating the tail current of the first two differential pairs. Accordingly, this third differential pair shunts the first and second differential pairs. The current that flows through the third differential pair flows through the tail resistors. When current flows through the third differential pair, less current will flow through the first and second differential pair. Accordingly, by applying an LO signal to the base of transistors of the third differential pair, the current through the first and second differential pairs can be controlled by the LO signal.

Because the degeneration resistors are coupled directly to the negative power supply terminal through only the tail resistors, and further, because the degeneration resistors of the third differential pair are coupled directly to the negative power supply terminal through only the tail resistors, the power supply voltage need only be divided between one active device, the load, the degeneration resistance, and the tail resistor in any one leg of the circuit. Furthermore, since there is only one active device in any one leg of the circuit, the voltage of the power supply can be reduced.

The details of the preferred embodiment of the present invention are set forth in the accompanying drawings and the description below. Once the details of the invention are known, numerous additional innovations and changes will become obvious to one skilled in the art.

BRIEF DESCRIPTION OF THE DRAWINGS

Like reference numbers and designations in the various drawings refer to like elements.

DETAILED DESCRIPTION OF THE INVENTION

Throughout this description, the preferred embodiment and examples shown should be considered as exemplars, rather than limitations on the present invention.

Figure 1:
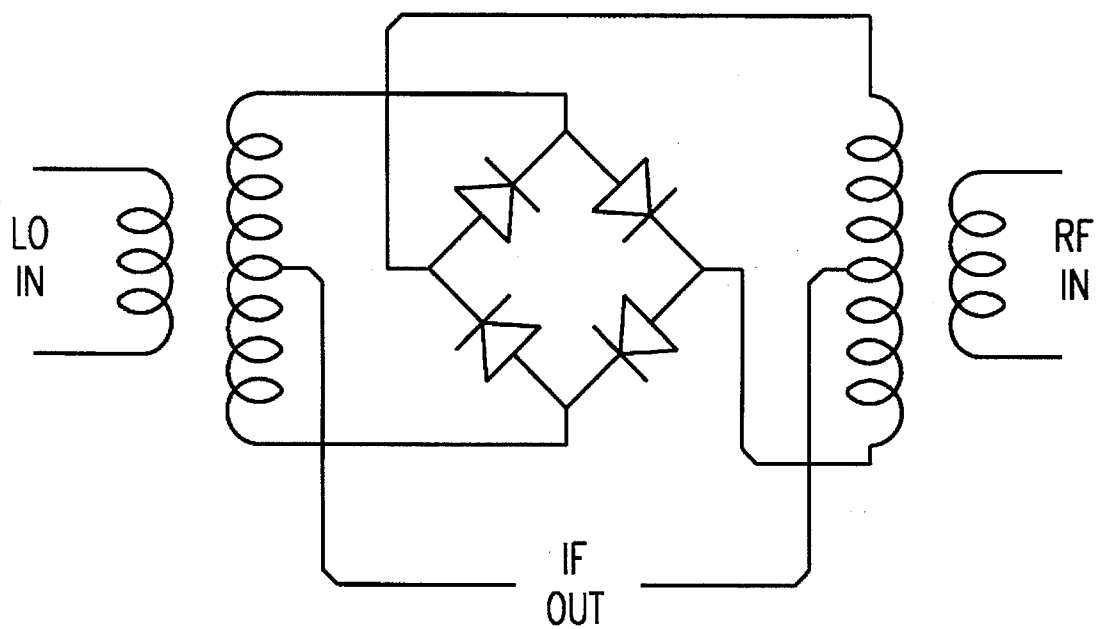
FIG. 1 is a circuit diagram of a prior art diode-ring mixer circuit.
Figure 2:
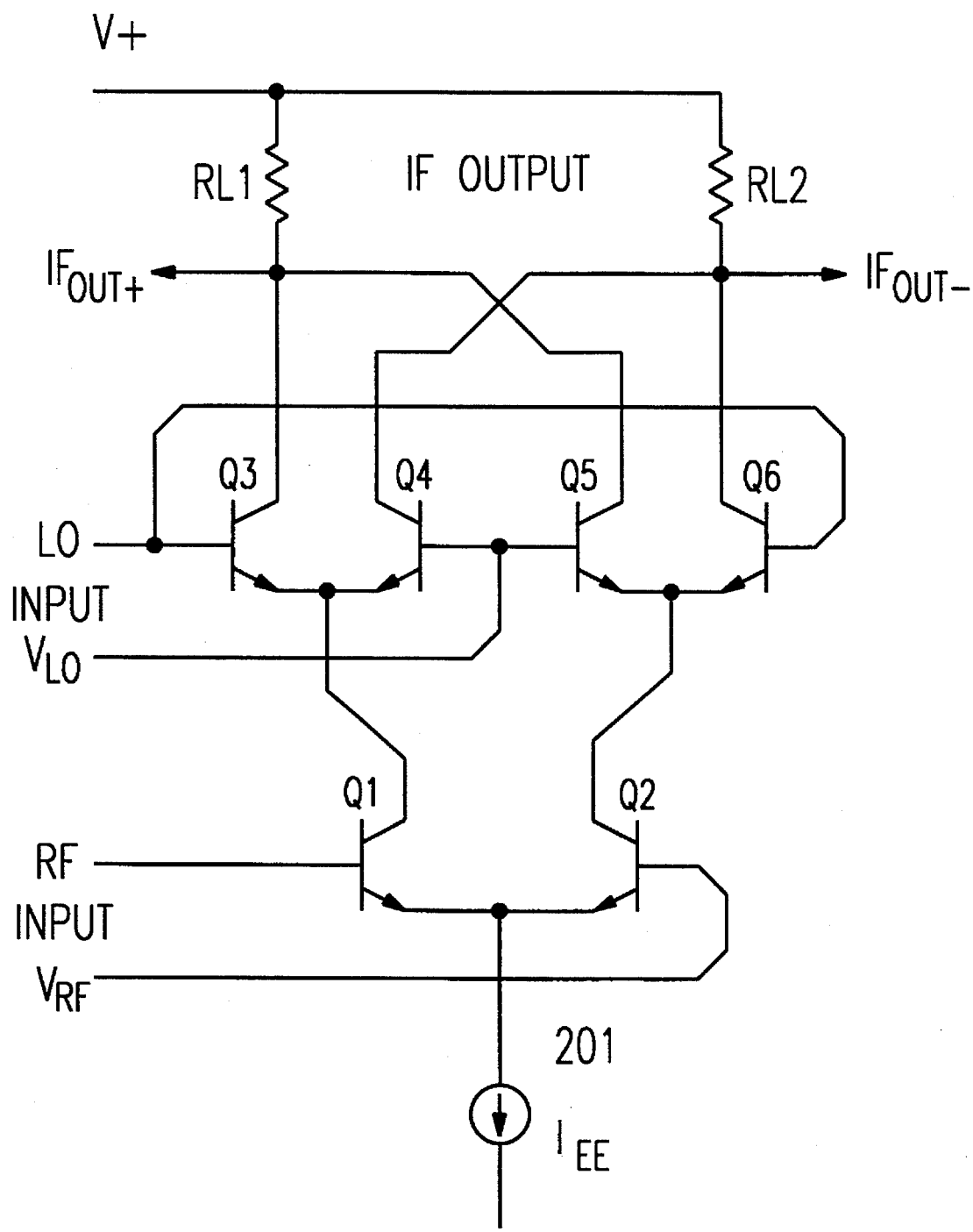
FIG. 2 is an illustration of a prior art Gilbert mixer.
Figure 3:
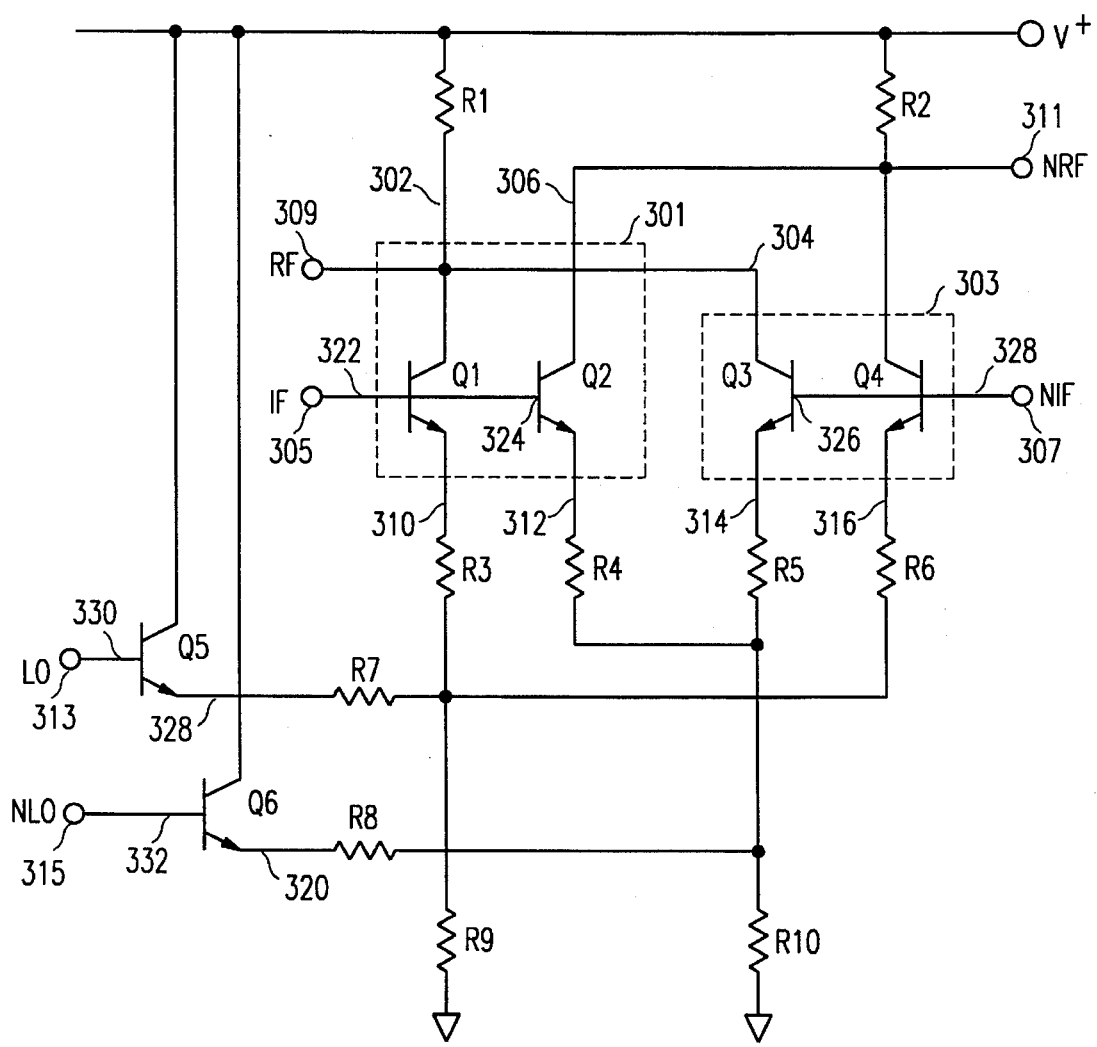
FIG. 3 is an illustration of one embodiment of the present invention.

The present invention is a low voltage mixer circuit. FIG. 3 is an illustration of one embodiment of the present invention. A first active three port device (such as transistor Q1) is coupled to a second active three port device (such as transistor Q2,) to form a first differential pair 301. Current that flows through each active device Q 1, Q2 is sourced from the positive terminal $V^+$ of the voltage source. The current flows from the positive terminal $V^+$ through one of two load resistors R1, R2 into the input port 302, 306 (such as the collector) of an associated one of the two active devices Q1, Q2. An output port 310, 312 (such as the emitter) of each active device Q1, Q2 is coupled to an associated degeneration resistor R3, R4, respectively. The degeneration resistors R3, R4 provide degenerative feedback for the associated active device. That is, when an increase in current occurs due to an increase in the voltage applied at the control ports 322, 324 (such as the base) of the active devices Q 1, Q2, the voltage drop across degeneration resistors R3, R4 will increase. The increased current also flows through each tail resistor R9, R10. The voltage drop across the degeneration resistors R3, R4 sums with the voltage drop across two tail resistors R9, R10 to determine the voltage at the output ports 310, 312 of the two active devices Q1, Q2. Therefore, the voltage at the output ports 310, 312 of each of the active devices Q1, Q2 increases as a result of the increase in current through the resistors R3, R4, R9, R10. This increase at the output ports 310, 312 causes the voltage between the control ports 322, 324 to decrease with respect to the voltage at the output ports 310, 312. A decrease in the voltage between the control ports 322, 324 and the output ports 310, 312 will result in an associated decrease in the current through the active device Q 1, Q2. Thus, negative feedback is provided. By providing negative feedback in this way, the gain of each of the active devices is reduced and the linearity of the circuit is increased.

A second differential pair 303 is formed by another two active devices (such as transistors Q3, Q4). The second differential pair 303 is essentially identical to the first differential pair 301. However, the output ports 314, 31.6 of each of the two active devices Q3, Q4 of the second differential pair 303 are coupled to a different one of two additional degeneration resistors RS, R6 associated with the second differential pair 303. Accordingly, the operation of the second differential pair 303 is essentially identical to the operation of the first differential pair 301. The input ports of the active devices Q 1, Q2 of the first differential pair 301 are coupled to a positive intermediate frequency (IF) input signal terminal 305. The control inputs 326, 328 (such as the bases) of the active devices Q3, Q4 of the second differential pair 303 are coupled to a negative IF input signal terminal 307. In operation, an IF input signal is applied between the positive and negative IF input signal terminals 305, 307. A positive radio frequency (RF) output signal terminal 309 is taken across the input ports 302, 304 (such as the collectors) of the active devices Q1, Q3. A negative RF output signal terminal 311 is coupled to the input ports 306, 308 (such as the collectors) of the active devices Q2, Q4. Accordingly, the first and second differential pairs 301,303 are cross-coupled. The differential operation of the two differential pairs 301, 303 provide common mode rejection of noise on the IF input signal. That is, noise that is common to signals applied to both the positive and negative IF input terminals will not be detected at the differential output taken across the RF output signal terminals 309, 311. Furthermore, the cross-coupling of the first and second differential pairs 301,303 provides port to port isolation. That is, the IF signal will not be detected across the RF output signal terminals 309, 311.

Coupled in parallel with the series circuit that includes the active device Q1, the load resistor R1, and the tail resistor R9 is another series circuit that includes an active device (such as transistor Q5) and a degeneration resistor R7. The series circuit comprising the active device Q5 and a degeneration resistor R7 is also in parallel with the series circuit that comprises the active device Q4, the load resistor R2, and the degeneration resistor R6. Accordingly, the current that flows through the tail resistor R9 is the sum of the currents through each of these three series circuits (i.e., the sum of the currents through each of the active devices Q1, Q4, Q5). In the preferred embodiment of the present invention, the current through the two tail resistors R8, R9 attempts to remain constant due to the negative feedback which results from the rise in the voltage drop across the resistor R9 when the current through R9 increases. This negative feedback effect causes each of the three active devices Q1, Q4, Q5 that source current to the resistor R9 to conduct less current. In effect, an increase in the current through the active device Q5 will cause a shift in the ratio of the currents that are supplied by to the tail resistor R9 in favor of the active device Q5.

A second series circuit which includes an active device (such as transistor Q6) and a degeneration resistor R8 is provided in parallel with two series circuits. The first of these series circuits includes the active device Q2, the degeneration resistor R4, and the load resistor R2. The second of these series circuits includes the active device Q3, the degeneration resistor R5, and the load resistor R1.

The control input 330 (such as the base) of the active device Q5 is coupled to a positive local oscillator (LO) input signal terminal 313. The control inpm 332 (such as the base) of the active device Q6 is coupled to a negative LO input signal terminal 315. By applying an LO input signal across the LO input signal terminals 313, 315, the current through each load resistor R1, R2 will be modulated with the LO signal. That is, as the current through the active device Q5 increases due to the signal applied to the positive LO input signal terminal 313, the current through the tail resistor R9 will increase. This causes the voltage at the output ports 310, 316, 318 of each of the active devices Q1, Q4, Q5 to rise and thus reduce the current that flows through the load resistors R1, R2 by an amount that is dependent upon the level of the LO signal. Likewise, as the current increases through the active device Q6 due to the signal at the negative LO input signal terminal 315, the current through the tail resistor R10 will increase. Accordingly, the voltage at the output ports 312, 314, 320 of the active devices Q2, Q3, and Q6 rises and so the current through the load resistors R1, R2 is reduced. It is this modulation of the IF input signal by the LO input signal that causes the RF output signal to have a frequency that is the product of the frequency of the IF and LO input signals.

Since there is only one active device in each series circuit coupled between the positive power supply terminal and the negative power supply terminal, the present invention operates in the linear region of each active device with a relatively low power supply voltage. That is, in one embodiment of the present invention, the power supply voltage may be as low as 1.5 volts, and yet each of the active devices will operation linearly with an IF input signal of −2.0 dBm applied across the IF input signal terminals and an LO input signal of 0.0 dBm applied across the LO input signal terminals.

Figure 4:
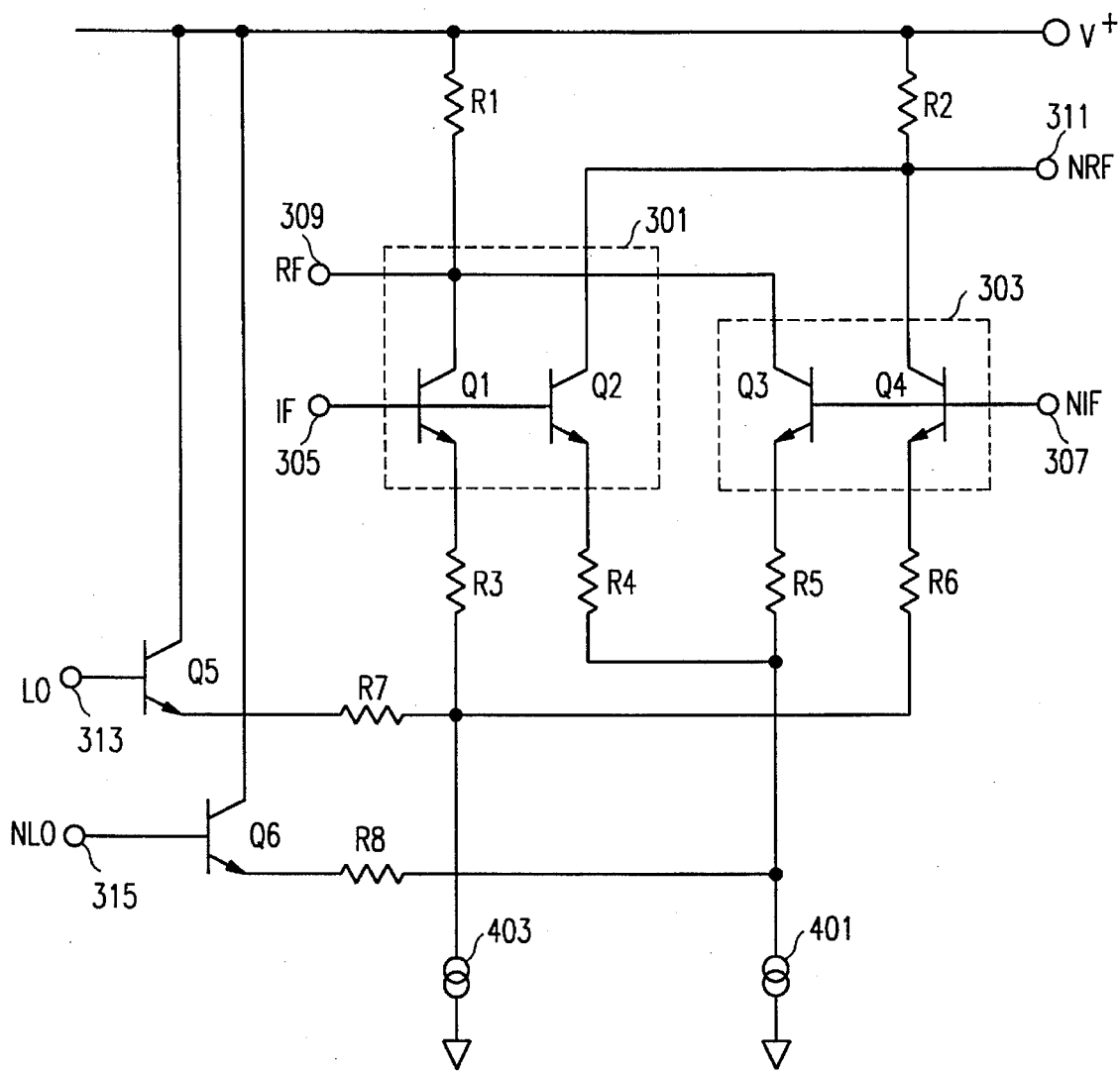
FIG. 4 is an illustration of an alternative embodiment of the present invention.

In an alternative embodiment of the present invention, shown in FIG. 4, the tail resistors are each replaced with a constant current source 401,403. By ensuring that the current through the constant current source is constant, the changes at the input port of the active devices Q5, Q6 will cause reciprocal changes in the current through the load resistors R1, R2. That is, since the current that flows through the constant current source 403 is the stem of the current that flows through the active devices Q1, Q4, Q5, a change in the current that flows through one of the active devices Q1, Q4, Q5 will cause a reciprocal change in the current through the other two active devices such that the sum of the currents is unchanged.

In yet another alternative embodiment, the degeneration resistors R7, R8 may be removed (valued at 0 ohms) in order to increase the conversion gain. However, the output will no longer be linear with respect to the LO input. Nonetheless, this circuit is suitable for use as a mixer.

In another alternative embodiment of the present invention, the load resistors R1, R2 are frequency sensitive devices, such as tuned circuits, coils, capacitors, etc., which are tuned to pass a desired output frequency, or block an undesired output frequency, such as the LO frequency.

SUMMARY

A number of embodiments of the present invention have been described Nevertheless, it will be understood that various modifications may be made without departing from the spirit and scope of the invention. For example, the active devices of the present invention are presented as transistors for ease of understanding and simplicity. However, the active devices may be any active device, such as thin film active devices, field effect transistors, light modulation optical devices, etc. Furthermore, the passive devices are described above as resistors. However, each passive device may be a tuned inductor, capacitor, or other passive device. Still further, the constant current source of the present invention may be any circuit that maintains a relatively constant current by regulating the resistance (and thus the voltage drop across the circuit). Accordingly, it is to be understood that the invention is not to be limited by the specific illustrated embodiment, but only by the scope of the appended claims.

I claim:

1. A mixer circuit powered by a power supply having a positive and a negative power supply terminal, for performing analog multiplication of a first and second differential input signal, each signal having a positive and a negative component, including:

a. a first and a second active three port device, each having a control port, an input port, and an output port;
   i. the control ports of the first and second active devices being coupled together;
b. a first load device having at least two terminals, a first terminal being coupled to the positive power supply terminal;
c. a second load device having at least two terminals, a first terminal being coupled to the positive power supply terminal;
d. a third and fourth active three port device, each having a control port, an input port, and an output port;
   i. the control ports of the third and fourth active devices being coupled together;
   ii. the input port of the third active device being coupled to the input port of the first active device and to a second terminal of the first load device;
   iii the input port of the fourth active device being coupled to the input port of the second active device and to a second terminal of the second load device;

e. a fifth active three port device, having a control port, an input port, and an output port, the input port being coupled to the positive power supply terminal and f. a sixth active three port device, having a control port, an input port, and an output port, the input port being coupled to the positive power supply terminal;

g. a first, second, third, fourth, fifth, and sixth two input resistive device, (i) the first resistive device being coupled between the output of the first active device and the negative power supply terminal, (ii) the second resistive device being coupled between the output of the second active device and the negative power supply terminal, (iii) the third resistive device being coupled between the output of the third active device and the negative power supply terminal, (iv) the fourth resistive device being coupled between the output of the fourth active device and the negative power supply terminal, (v) the fifth resistive device being coupled between the output of the fifth active device and the negative power supply terminal, and (vi) the sixth resistive device being coupled between the output of the sixth active device and the negative power supply terminal;

wherein the positive component of the first input signal is coupled to the control port of the first active device, the negative component of the first input signal is coupled to the control port of the third active device, the positive component of the second input signal is coupled to the control port of the fifth active device, the negative component of the second input signal is coupled to the control input to the sixth active device, and the output signal is taken across the output ports of the first and second active devices.

2. The mixer circuit of claim 1, wherein each of the active three port devices is a transistor.

3. The mixer circuit of claim 1, wherein each load device is a resistor.

4. The mixer circuit of claim 1, wherein at least one of the load devices is a frequency sensitive device.

5. The mixer circuit of claim 1, wherein the first differential input signal is an radio frequency signal, the second differential input signal is a local oscillator signal, and the output signal is an intermediate frequency signal.

6. The mixer circuit of claim 1, wherein the first differential input signal is a local oscillator signal, the second differential input signal is a radio frequency signal, and the output signal is an intermediate frequency signal.

7. The mixer circuit of claim 1, wherein the first differential input signal is an intermediate frequency signal, the second differential input signal is a local oscillator signal, and the output signal is a radio frequency signal.

8. The mixer circuit of claim 1, wherein the first differential input signal is a local oscillator signal, the second differential input signal is an intermediate frequency signal, and the output signal is a radio frequency signal.

9. A mixer circuit powered by a power supply having a positive and a negative power supply terminal, for analog multiplication of a first and second differential input signal, each having a positive and a negative component, including:

a. a first and a second active three port device, each having a control port, an input port, and an output port;
   i. the control ports of the first and second active devices being coupled together, b. a first load device having at least two terminals, a first terminal being coupled to the positive power supply terminal;

c. a second load device having at two terminals, a first terminal being coupled to the positive power supply terminals;

d. a third and fourth active three device, each having a control port, an input port, and an output port;
   i. the control ports of the and third and fourth active devices being coupled together;
   ii the input of the third active device being coupled to the input port of the first active device and to a second terminal of the first load device;
   iii. the input port of the fourth active device being coupled to the input port of the second active device and to a second terminal of the second load device;

e. a fifth active three port device, having a control port, and an output port, the input port being coupled to the positive power supply terminal; and f. a sixth active three port device, having a control port, an input port, and an output port, the input port being coupled to the positive power supply terminal;

g. a first and second constant current source, each having an input and an output, the output of each constant current source being coupled to the negative power supply;

h. a first, second, third, fourth, fifth, and sixth two input resistive device, (i) the first input of the first resistive device being coupled to the output to the first active device and the second input being coupled to the first constant current source, (ii) the first input of the second resistive device being coupled to the output of the second active device and the second input of the second resistive device being coupled to the second constant current device, (iii) the first input of the third resistive device being coupled to the output of the third active device and the second input of the third resistive device being coupled to the second constant current device, (iv) the first input of the fourth resistive device being couple to the output of the fourth active device and the second input of the fourth resistive device being coupled to the first constant current source, (v) the first input of the fifth resistive device being coupled the output of the fifth active device and the second input of the fifth resistive device being coupled to the first constant current source, and (vi) the first input of the sixth resistive device being coupled to the output of the sixth active device and the second input of the sixth resistive device being coupled to the second constant current source;

wherein the positive component of the first input signal is coupled to the control port of the first active device, the negative component of the first input signal is coupled to the control port of the third active device, the positive component of the second input signal is coupled to the control port of the fifth active device, the negative component of the second input signal is coupled to the control, input of the sixth active device and the output signal is taken across the output ports of the first and second active devices.

10. The mixer circuit of claim 9, wherein each of the active three port devices is a transistor.

11. The mixer circuit of claim 9, wherein each load device is a resistor.

12. The mixer circuit of claim 9, wherein at least one of the load devices is a frequency sensitive device.

13. The mixer circuit of claim 9, wherein the first differential input signal is an radio frequency signal, the second differential input signal is a local oscillator signal, and the output signal is an intermediate frequency signal.

14. The mixer circuit of claim 9, wherein the first differential input signal is a local oscillator signal, the second differential input signal is a radio frequency signal, and the output signal is an intermediate frequency signal.

15. The mixer circuit of claim 9, wherein the first differential input signal is an intermediate frequency signal, the second differential input signal is a local oscillator signal, and the output signal is a radio frequency signal.

16. The mixer circuit of claim 9, wherein the first differential input signal is a local oscillator signal, the second differential input signal is an intermediate frequency signal, and the output signal is a radio frequency signal.

17. A mixer circuit powered by a power supply having a positive and a negative power supply terminal, for performing analog multiplication of a first and second differential input signal, each having a positive and a negative component, including:

a. a first and a second active three port device, each having a control port, an input port, and an output port;
   i. the control ports of the first and second active devices being coupled together;

b. a first load device having at least two terminals, a first terminal being coupled to the positive power supply terminal;

c. a second load device having at least two terminals, a first terminal being coupled to the positive power supply terminal;

d. a third and fourth active port device, each having a control port, an input port, and an output port;
   i. the control ports of the third and fourth active devices being coupled together;
   ii the input port of the third active device being coupled to the input port of the first active device and to a second terminal of the first load device;
   iii. the input port of the fourth active device being coupled to the input port of the second active device and to a second terminal of the second load device;

e. a fifth active three port device, having a control port, an input port, and an output port, the input port being coupled to the positive power supply terminal; and f. a sixth active three port device, having a control port, an input port, and an output port, the input port being coupled to the positive power supply terminal;

g. a first and second tail resistance, each having an input and an output, the output of each tail resistance being coupled to the negative power supply;

h. a first, second, third, fourth, fifth and sixth two input resistive device, (i) the first input of the first resistive device being coupled to the output of the first active device and the second input being coupled to the first tail resistance, (ii) the first input of the second resistive device being coupled to the output of the second active device and the second input of the second resistive device being coupled to the second tail resistance, (iii) the first input of the third resistive device being coupled to the output of the third active device and the second input of the third resistive device being coupled to the second tail resistance, (iv) the first input of the fourth resistive device being coupled to the output of the fourth active device and the second input of the fourth resistive device being coupled to the first tail resistance, (v) the first input of the fifth resistive device being coupled to the output of the fifth active device and the second input of the fifth resistive device being coupled to the first tail resistance, and (vi) the first input of the sixth resistive device being coupled to the output of the sixth active device and the second input of the sixth resistive device being coupled to the second tail resistance;

wherein the positive component of the first input signal is coupled to the control port of the first active device, the negative component of the first input signal is coupled to the control port of the third active device, the positive component of the second input signal is coupled to the control port of the fifth active device, the negative component of the second input signal is coupled to the control input of the sixth active device, and the output signal is taken across the output ports of the first and second active devices.

18. The mixer circuit of claim 17, wherein each of the active three port devices is a transistor.

19. The mixer circuit of claim 17, wherein each load device is a resistor.

20. The mixer circuit of claim 17 wherein the first differential input signal is an radio frequency signal, the second differential input signal is a local oscillator signal, and the output signal is an intermediate frequency signal.

21. The mixer circuit of claim 17, wherein the first differential input signal is a local oscillator signal, the second differential input signal is a radio frequency signal, and the output signal is an intermediate frequency signal.

22. The mixer circuit of claim 17, wherein the first differential input signal is an intermediate frequency signal, the second differential input signal is a local oscillator signal, and the output signal is a radio frequency signal.

23. The mixer circuit of claim 17, wherein the first differential input signal is a local oscillator signal, the second differential input signal is an intermediate frequency signal, and the output signal is a radio frequency signal.

\* \* \* \* \*